United States Patent [19]

Gossard et al.

[11] Patent Number: 4,578,127

[45] Date of Patent: Mar. 25, 1986

[54] METHOD OF MAKING AN IMPROVED GROUP III-V SEMICONDUCTOR DEVICE UTILIZING A GETTER-SMOOTHING LAYER

[75] Inventors: Arthur C. Gossard, Warren; Robert C. Miller, Summit; Pierre M. Petroff, Westfield, all of N.J.

[73] Assignee: AT&T Bell Laboratories, Murray Hill, N.J.

[21] Appl. No.: 408,009

[22] Filed: Aug. 13, 1982

[51] Int. Cl.[4] .................. H01L 21/203; H01L 21/363
[52] U.S. Cl. .................. 148/175; 29/576 E; 29/569 L; 148/DIG. 25; 148/DIG. 60; 148/DIG. 72; 148/DIG. 169; 156/610; 156/612; 156/DIG. 61; 156/DIG. 81; 156/DIG. 103; 156/DIG. 66; 357/16; 372/46
[58] Field of Search .................. 29/576 E, 569 L; 156/610, 612, DIG. 61, 81, 103, 66; 357/16; 372/46; 148/175, DIG. 25, DIG. 60, DIG. 72, DIG. 169

[56] References Cited

U.S. PATENT DOCUMENTS

| | | | |
|---|---|---|---|
| 3,915,765 | 10/1975 | Cho et al. | 148/175 |
| 3,982,207 | 9/1976 | Dingle et al. | 357/16 X |
| 4,137,107 | 1/1979 | Nijman et al. | 148/175 X |
| 4,163,237 | 7/1979 | Dingle et al. | 357/16 |
| 4,194,935 | 3/1980 | Dingle et al. | 29/576 E X |
| 4,213,808 | 7/1980 | Thompson et al. | 148/175 X |

OTHER PUBLICATIONS

H. L. Stormer et al., "Dependence of Electron Mobility in Modulation-Doped GaAs-(AlGa)As Heterojunction Interfaces on Electron Density and Al Concentration," *Applied Physics Letters*, vol. 39, No. 11, Dec. 1, 1981, pp. 912–914.

T. J. Drummond et al., "Dependence of Electron Mobility on Spatial Separation of Electrons and Donors in $Al_xGa_{1-x}As/GaAs$ Heterostructures," *Journal of Applied Physics*, vol. 52, No. 3, Mar. 1981, pp. 1380–1386.

G. Bastard, "Hydrogenic Impurity States in a Quantum Well: A Simple Model," *Physical Review B*, vol. 24, No. 8, Oct. 15, 1981, pp. 4714–4722.

Hersee et al., "New Approach to the Gettering of Oxygen . . . MOCVD", *J. Crystal Growth*, v. 55, 1981, pp. 53–57.

Stormer et al., "Influence of an Undoped (AlGa)As Spacer . . . ", *Appl. Phys. Lett.*, vol. 38, No. 9, May 1, 1981, pp. 691–693.

R. Dingle et al., "Electron Mobilities in Modulation-Doped Semiconductor Heterojunction Superlattices," *Applied Physics Letters*, vol. 33, No. 7, Oct. 1, 1978, pp. 665–667.

A. C. Gossard et al., "Epitaxial Structures with Alternate-Atomic-Layer Composition Modulation," *Applied Physics Letters*, vol. 29, No. 6, Sep. 15, 1976, pp. 323–325.

P. M. Petroff et al., "Luminescence Properties of $GaAs-Ga_{1-x}Al_xAs$ Double Heterostructures and Multiquantum-Well Superlattices Grown by Molecular Beam Epitaxy," *Applied Physics Letters*, No. 12, vol. 38, Jun. 15, 1981, pp. 965–967.

Primary Examiner—William G. Saba
Attorney, Agent, or Firm—Richard D. Laumann

[57] ABSTRACT

Single GaAs quantum well or single GaAs active layer or single reverse interface structures with $Al_xGa_{1-x}As$ barrier layers have improved qualities when one or more narrow bandgap GaAs getter-smoothing layers, which are thin, are grown and are incorporated in the barrier layer before and in close proximity to the active layer.

7 Claims, 2 Drawing Figures

METHOD OF MAKING AN IMPROVED GROUP III-V SEMICONDUCTOR DEVICE UTILIZING A GETTER-SMOOTHING LAYER

TECHNICAL FIELD

This invention relates to semiconductor devices and methods of making such devices.

BACKGROUND OF THE INVENTION

Many types of semiconductor devices have been investigated in recent years in attempts to obtain, for example, devices with desirable characteristics such as enhanced carrier mobility. For example, U.S. Pat. No. 4,163,237 issued on July 31, 1979 to Raymond Dingle, Arthur C. Gossard, and Horst L. Stormer, describes a multilayered device having a plurality of alternate wide and narrow bandgap layers with modulated doping, i.e., the wide bandgap layers are more heavily doped than the narrow bandgap layers, and high mobility. The modulated doping permits the device, commonly termed a quantum well structure, to have electron mobilities which are higher than those in devices having uniformly doped films. See *Applied Physics Letters,* 33, pp. 665–667, Oct. 1, 1978. In one embodiment of such devices, the devices are fabricated with the AlGaAs/GaAs materials system.

Such quantum well structures, which, of course, need not have modulated doping, have been extensively investigated. For example, multiple layer AlGaAs/GaAs quantum well structures that were grown by molecular beam epitaxy (MBE) have been shown to possess atomically smooth interfaces as well as uniform layer thicknesses. See, for example, *Applied Physics Letters,* 29, pp. 323–325, Sept. 15, 1976. Photoluminescence spectra from these structures were predominantly intrinsic. See, for example, *Applied Physics Letters,* 38, pp. 965–967, June 15, 1981. This fact suggests both high sample purity and luminescence efficiency.

However, several aspects regarding operation and characteristics of these devices have remained puzzling to workers in the field. For example, luminescence studies of some structures having a single GaAs quantum well showed extrinsic, impurity dominated luminescence as well as nonuniformities in the layer thickness. Further, inequivalences were observed in the electrical transport properties of AlGaAs/GaAs single interfaces which apparently depended upon which layer was grown first. Additionally, in modulation doped single interfaces having the GaAs layer grown first, electron mobilities were observed which were higher than those observed in multiquantum well structures. See, *Applied Physics Letters,* 39, pp. 912–914, Dec. 1, 1981. In structures having reverse single interfaces in which the AlGaAs layer was grown first, however, the electron mobility was either lower or no mobility enhancement was observed. It should be further noted that it has been reported that multiple quantum well structures, in which each quantum well contains a reverse interface, show more mobility enhancement than the single reverse interface structures.

See *Journal of Applied Physics,* 52, pp. 1380–1386, March 1981.

SUMMARY OF THE INVENTION

We have found that a semiconductor device having a single semiconductor active layer and a thin semiconductor cladding layer adjacent said active layer has desirable properties when a semiconductor getter-smoothing layer is grown prior to growth of the cladding layer. In one embodiment, the active and getter-smoothing layers have narrow bandgaps and the cladding layer has a wide bandgap. The getter-smoothing layer is typically between 10 and 10,000 Angstroms thick and the adjacent wide bandgap cladding layer is typically between 50 and 500 Angstroms thick although it may be as thick as 1500 Angstroms. The device, which may be, for example, a quantum well optical device, a double heterostructure laser, or a field effect transistor, may further comprise other elements such as a second cladding layer or a buffer layer between the substrate and getter-smoothing layer. In one preferred embodiment, the getter-smoothing layer and active layer material comprises GaAs and the wide bandgap cladding material comprises $Al_xGa_{1-x}As$.

DETAILED DESCRIPTION

Figure 1:
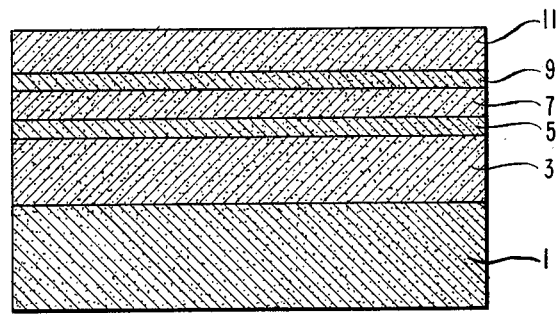
FIG. 1 is a sectional view of a device according to this invention.

Referring now to FIG. 1, there is shown an illustrative embodiment of our invention. For reasons of clarity, the elements of the device are not drawn to scale. The device comprises substrate 1, and diverse layers including a first particle or light confining layer 3, i.e., a cladding layer, a getter-smoothing layer 5, a second particle confining layer 7, i.e., a cladding layer, a single active layer 9, and a third confining layer 11, i.e., a cladding layer. In one embodiment, layers 3, 7, and 11 comprise wide bandgap materials and layers 5 and 9 comprise narrow bandgap materials. The active layer is the region where electron-hole recombination, light absorption, or carrier transport occurs. The cladding layers confine light or carriers. The getter-smoothing layer 5 is relatively thin, that is, it desirably has a thickness between 10 and 100 Angstroms although greater thicknesses may be used. The second particle confining layer, i.e., cladding layer 7, is thin and desirably has thickness between 50 and 500 Angstroms although it may be as thick as 1500 Angstroms. The layers comprise a Group III-V compound semiconductor. In an illustrative embodiment, the narrow bandgap layers comprise $Al_xGa_{1-x}As$ and the wide bandgap layers comprise $Al_xGa_{1-x}As$, x greater than or equal to 0.0 and less than or equal to 1.0. The substrate 1 and layer 11 are contacted electrically by means that are well known to those working in the art.

The devices of our invention are conveniently fabricated by molecular beam epitaxy techniques. The growth of devices according to our invention by this technique is well understood by those working in the art and therefore need not be described in detail.

The device may be a quantum well optical device, a double heterostructure laser or a field effect transistor. The thickness of the active layer will depend on the contemplated device application as is well understood by those working in the art. For example, the quantum well device will typically have a thickness between 20 Angstroms and 500 Angstroms. Structural modifications of the embodiment depicted are also contemplated. For example, the getter-smoothing layer may comprise a plurality of narrow bandgap layers, i.e., a superlattice, and the second cladding layer 11 may be omitted in some devices as may layer 3.

The critical nature of the thickness of the first, i.e., getter-smoothing layer in structures having a single GaAs quantum well bounded by $Al_xGa_{1-x}As$ barrier layers is shown by the following. Several structures were grown with different compositions in the underlying layers. In particular, structures were grown on (100) oriented GaAs substrates under $As_2$ rich growth conditions. These structures had (1) a single 100 Angstrom quantum well, i.e., active layer, grown on a 1700 Angstrom $Al_{0.3}Ga_{0.7}As$ cladding layer; (2) a single quantum well grown on a similar $Al_xGa_{1-x}As$ cladding layer with a single 10 Angstrom GaAs getter-smoothing layer 100 Angstroms below the 100 Angstrom quantum well; and (3) a single 100 Angstrom quantum well with a single 50 Angstrom getter-smoothing layer 100 Angstroms below the 100 Angstrom quantum well. All structures were grown with a substrate temperature during growth of approximately 690 degrees C. and the growth commenced a 100 Angstrom GaAs layer followed by a six layer superlattice having 30 Angstrom layers of GaAs and 50 Angstrom layers of $Al_{0.3}Ga_{0.7}As$. The 100 Angstrom quantum well in each structure was capped with a 600 Angstrom $Al_{0.3}Ga_{0.7}As$ layer.

Photoluminescence and photoluminescence excitation spectra were measured at a temperature of approximately 6 degrees K. for these structures. Photoluminescence was excited at 1.737 eV with an intensity of 0.9 W/cm$^2$. It was found that there was a strong increase in photoluminescence intensity from the 100 Angstrom quantum well when the thin GaAs prelayer, i.e., getter-smoothing layer, was present below the 100 Angstrom quantum well. Both the 10 Angstrom and 50 Angstrom prelayers, i.e., getter-smoothing layers, improved the optical properties of the quantum well. However, much greater improvement was obtained with the 50 Angstrom thick prelayer. The position of the quantum well luminescence line was identified as being that of an electron to neutral acceptor recombination in a 100 Angstrom GaAs layer. The excitation spectrum of the quantum well luminescence was also sharpest for the device having the 50 Angstrom thick prelayer and peaks at an exciting photon energy equal to the lowest intrinsic quantum well exciton energy for a 100 Angstrom thick layer. This series of structures show that the first narrow bandgap layer should desirably have a thickness between 10 and 100 Angstroms although layers with still greater thicknesses, i.e., up to 10,000 Angstroms, might be used.

An additional series of structures was grown which comprises (a) a single 100 Angstrom thick GaAs quantum well layer grown on a 1 micron thick $Al_{0.3}Ga_{0.7}As$ layer; (b) a single 100 Angstrom GaAs quantum well layer grown on a thinner 200 Angstrom thick $Al_{0.3}Ga_{0.7}As$ layer; and (c) a single 100 Angstrom thick GaAs quantum well grown on a micron thick superlattice of alternating 200 Angstrom thick $Al_{0.3}Ga_{0.7}As$ layers and 200 Angstrom thick GaAs layers. Additionally, a GaAs buffer layer having a thickness between 0.5 $\mu$m and 1.0 $\mu$m as well as a 600 Angstrom thick $Al_{0.3}Ga_{0.7}As$ cap layer were grown on all structures. The substrate temperature during growth of these structures was 690 degrees C.

This series of structures demonstrates the effect of the thickness of the underlying $Al_xGa_{1-x}As$ layer, i.e., the second wide bandgap cladding layer, as well as the presence of the thin well superlattice on the properties of the single quantum well layer of GaAs. Photoluminescence was excited at 1.710 eV with an intensity of 4.9 W/cm$^2$. For the thick $Al_{0.3}Ga_{0.7}As$ layer, i.e., structure (a), weak photoluminescence occurred at the energy expected for electron recombination with a neutral acceptor near one side of the quantum well. The excitation spectrum showed peaks at 100 Angstrom quantum well exciton energies with widths corresponding to approximately 4 GaAs monolayers of nonuniformity of the quantum well layer thickness. With both the thin $Al_{0.3}Ga_{0.7}As$ layer and the superlattice, i.e., structures (b) and (c), respectively, stronger and sharper photoluminescence occurred with the photoluminescence from the 100 Angstrom quantum well observed at the intrinsic quantum well free exciton energy. This suggests higher layer purity. Excitation spectra peaks were also sharper and more intense with widths corresponding to layer thickness nonuniformities of approximately one GaAs monolayer. The interfaces sensed by the excitons are therefore essentially atomically smooth. The AlGaAs cladding layer, i.e., the thin wide bandgap layer 7, should thus have a thickness less than approximately 1500 Angstroms.

These structures show that growth of GaAs layers or superlattices, i.e., getter-smoothing layers, closely prior to a single GaAs quantum well improve both the smoothness and luminescent efficiency of the single quantum well. The smoothest layers have the highest photoluminescence intensity and the largest proportion of intrinsic luminescence relative to impurity luminescence. It is hypothesized that this is because the GaAs near smooth AlGaAs/GaAs interfaces contain fewer impurities or else that the electrons at the smoother interfaces interact less strongly with impurities that are near the interfaces. Evidence of the smoothing in the multi-quantum well sample has been seen by us in transmission electron microscopy cross-sectional images of multi-quantum well structures grown on initially rough surfaces.

Figure 2:
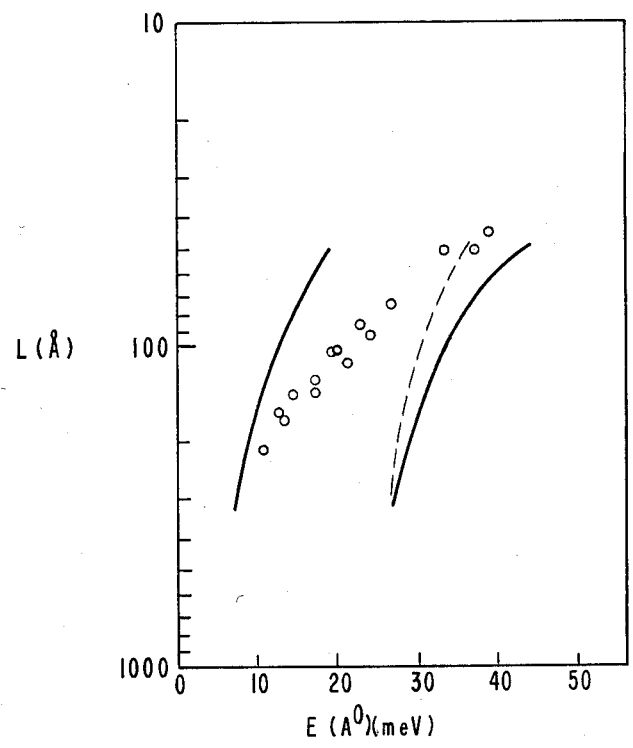
FIG. 2 plots the binding energies of the neutral acceptors horizontally in units of meV versus the GaAs well width in units of Angstroms vertically.

We hypothesize that the first $Al_xGa_{1-x}As$/GaAs heterojunction is often characterized by a situation in which the first several tens of Angstroms of the GaAs contain an acceptor-like impurity which produces extrinsic luminesence. Support for this hypothesis is found in FIG. 2 in which values of the binding energy of neutral acceptor are plotted horizontally in units of meV versus gallium arsenide layer thickness vertically in units of Angstroms for nine different wafers. Also shown in FIG. 2 is a dashed line which represents data from undoped multiquantum well samples. The structures we grew had a p-type (100) GaAs substrate, 1 $\mu$m GaAs buffer layer, 0.6 to 2.0 $\mu$m of $Al_xGa_{1-x}As$, a single GaAs quantum well, and 0.5 $\mu$m of $Al_xGa_{1-x}As$, and the data for these structures are indicated as circles. The right and left solid lines represent theoretical calculations by Bastard, *Physical Review* B, 24, pp. 4714–4722, 1981, for neutral carbon acceptors at the center of the well and at the $Al_xGa_{1-x}As$/GaAs interface, respectively. If the acceptors are uniformly distributed in the GaAs wells, one would expect extrinsic luminescence peaks at energies corresponding to acceptors at the center of the well. The present data suggest that there is a layer of GaAs at or near the interface which is several tens of Angstroms thick and contains an impurity which is presumably carbon. Thus for wide wells, for example, 150 Angstroms, the value is near that expected for acceptors near the interface; on the other hand, for narrow wells, for example, approximately 50 Angstroms, the extrinsic layer essentially fills the well so that the energy is more characteristic of impurities near the center of the well.

The origin of the impurity layer is not known with certainty but it is hypothesized to be caused by the following. The phenomena discussed can be explained by an impurity, probably carbon, that is pushed ahead in the growth direction as the $Al_xGa_{1-x}As$/vacuum interface advances and which degrades the interface smoothness due to its growth inhibiting nature. The impurity concentration builds up relatively slowly on the $Al_xGa_{1-x}As$ surface, i.e., hundreds of Angstroms will be grown before it reaches its maximum value. When the Al flux is terminated and the GaAs getter-smoothing layer grown, the impurity is deposited in a thin layer in the GaAs or perhaps desorbs from the surface. Thus, the wide bandgap layer 7 should be thin so that the concentration is low at the interface between layers 7 and 9.

These results have significance for $Al_xGa_{1-x}As$/GaAs heterostructure field effect transistor structures. There has been difficulty in obtaining mobility enhancement in modulation doped structures grown by molecular beam epitaxy when the GaAs layer is on the top. The impurity layers or interface roughness observed in some structures described here may be connected with this problem.

What is claimed is:

1. A method of fabricating a semiconductor device having at least one Group III–V semicondcutor comprising the steps of:
   growing a getter-smoothing layer on a semiconductor surface thereby gettering or desorbing impurities from the semiconductor surface, said getter-smoothing layer comprising a semiconductor and having a thickness between 10 and 100 Angstroms;
   growing a cladding layer comprising a semiconductor, said cladding layer having a thickness less than 1500 Angstroms, said cladding layer being contiouous with said getter-smoothing layer;
   and growing a single active layer comprising a semiconductor.

2. A method as recited in claim 1 in which said active and getter-smoothing layers comprise a narrow bandgap semiconductor and said cladding layer comprises a wide bandgap semiconductor.

3. A method as recited in claim 2 in which said getter-smoothing layer comprises $Al_xGa_{1-x}As$.

4. A method as recited in claim 2 comprising the further step of growing a second semiconductor cladding layer before growing said getter-smoothing layer.

5. A method as recited in claim 2, 3, or 4 in which said semiconductors comprise Group III–V compound semiconductors.

6. A method as recited in claim 5 in which said Group III–V compound semiconductors comprise $Al_xGa_{1-x}As$.

7. A method as recited in claim 6 in which x for said active layer is approximately 0.0.

* * * * *

UNITED STATES PATENT AND TRADEMARK OFFICE
CERTIFICATE OF CORRECTION

PATENT NO. : 4,578,127

DATED : March 25, 1986

INVENTOR(S) : Arthur C. Gossard, Robert C. Miller, Pierre M. Petroff

It is certified that error appears in the above-identified patent and that said Letters Patent is hereby corrected as shown below:

Column 6, line 12, "contiou" should read --contigu--

Signed and Sealed this

Twenty-third Day of September 1986

[SEAL]

Attest:

DONALD J. QUIGG

Attesting Officer

Commissioner of Patents and Trademarks